US012659635B2

(12) United States Patent
Lefevre et al.

(10) Patent No.: US 12,659,635 B2
(45) Date of Patent: Jun. 16, 2026

(54) METHOD AND APPARATUS FOR DOWNSTREAM TRANSMISSION

(71) Applicant: Nokia Solutions and Networks Oy, Espoo (FI)

(72) Inventors: Yannick Lefevre, Heverlee (BE); Laurens Breyne, Ingelmunster (BE); Michiel Verplaetse, Nazareth (BE)

(73) Assignee: Nokia Solutions and Networks Oy, Espoo (FI)

( * ) Notice: Subject to any disclaimer, the term of this patent is extended or adjusted under 35 U.S.C. 154(b) by 294 days.

(21) Appl. No.: 18/597,337

(22) Filed: Mar. 6, 2024

(65) Prior Publication Data

US 2024/0305917 A1     Sep. 12, 2024

(30) Foreign Application Priority Data

Mar. 8, 2023     (EP) ..................................... 23160744

(51) Int. Cl.
| | |
|---|---|
| *H04B 10/516* | (2013.01) |
| *H03M 13/27* | (2006.01) |
| *H04L 1/00* | (2006.01) |
| *H04Q 11/00* | (2006.01) |

(52) U.S. Cl.
CPC ........ *H04Q 11/0067* (2013.01); *H03M 13/27* (2013.01); *H04B 10/516* (2013.01); *H04L 1/0009* (2013.01); *H04L 1/0041* (2013.01); *H04L 1/0071* (2013.01)

(58) Field of Classification Search
CPC ............. H04B 10/516; H04Q 11/0067; H04L 1/0009; H04L 1/0071; H03M 13/27

USPC .................................................... 398/98, 183
See application file for complete search history.

(56) References Cited

U.S. PATENT DOCUMENTS

| | | | |
|---|---|---|---|
| 2003/0105996 A1* | 6/2003 | Dagan ................... | H04L 1/0071 714/701 |
| 2020/0007255 A1* | 1/2020 | Gareau ................. | H04J 3/1658 |
| 2021/0219033 A1* | 7/2021 | Lefevre ................ | H04L 1/0071 |

(Continued)

FOREIGN PATENT DOCUMENTS

| | | | | |
|---|---|---|---|---|
| EP | 3920441 A1 * | 12/2021 | ........... | H04L 1/0041 |

OTHER PUBLICATIONS

Office Communication for European Application No. 23 160 744.1 dated Feb. 14, 2025.

*Primary Examiner* — Li Liu
(74) *Attorney, Agent, or Firm* — Brake Hughes Bellermann LLP

(57) ABSTRACT

An apparatus configured to perform obtaining a stream of codewords, including a first type codeword and a second type codeword, wherein, the first type codeword is an idle codeword, and the second type codeword includes data intended for at least one of the ONUs; obtaining, an interleaved bitstream from the stream of codewords based on an interleaving scheme, wherein, in the interleaved bitstream, bits at positions corresponding the first type codeword include redundant bits, and bits at positions corresponding to the second type codeword include information bits; determining values for one or more redundant bits placed between two adjacent information bits in the interleaved bitstream based on the values of either or both of the two adjacent information bits; and transmitting the interleaved bitstream to one or more of the ONUs.

15 Claims, 7 Drawing Sheets

(56) References Cited

U.S. PATENT DOCUMENTS

| | | | |
|---|---|---|---|
| 2021/0399992 A1* | 12/2021 | Liu | H04J 3/1658 |
| 2023/0198670 A1* | 6/2023 | Strobel | H04L 1/0057 |
| | | | 370/310 |

* cited by examiner

METHOD AND APPARATUS FOR DOWNSTREAM TRANSMISSION

CROSS-REFERENCE TO RELATED APPLICATIONS

This application claims priority to and the benefit of European Patent Application No. 23160744.1 filed on Mar. 8, 2023, the entire contents of each of which are incorporated herein by reference.

FIELD OF THE INVENTION

Various example embodiments relate to optical networks, specifically to downstream communication in passive optical networks (PON).

BACKGROUND

In 2021, the Telecommunication Standardization sector of the International Telecommunication Union (ITU-T) standardization body published the G.9804 standard for 50G PON. This standard combines a 50G line rate in downstream (DS), with 12.5G and 25G in upstream (US). In September 2022, also a 50G US line-rate was consented for G.9804.

In current PON systems, operation is guaranteed for a certain minimal receive power or sensitivity. It is however possible that, during operation, an Optical Network Unit (ONU) is pushed beyond sensitivity by unforeseen circumstances. Such circumstances include for instance, fiber pulls or bends, dirty or faulty connectors, or excess heating of the ONU or Optical Line Terminal (OLT). Due to such circumstances, an ONU that is operating at the 50G sensitivity might no longer be able to receive and decode the 50G signal. In today's PON system, the ONU would go out of service, no on-line debugging would be possible, and the operator would have to send out an urgent repair.

The idea of a protection mode is to fall back to a mode that operates at a reduced rate, but offers an improved sensitivity. As such a fall-back protection mode, 25G operation is considered. For instance, in DS, a mixed modulation scheme that combines 25G with 50G could be used, in which the faulty ONU could use the 25G signal part.

The G.9804 PON standard uses 50G non-return to zero (NRZ) signals. The 25G protection mode could either be 25G NRZ signals or 25G Miller-encoded (or delay-encoded) signals. 25G NRZ offers more protection, i.e., a lower sensitivity, but may have more impact on the 50G NRZ performance after equalization, as the presence of 25G NRZ may affect the 50G NRZ equalizer coefficients, while the 25G Miller still offers good protection, but less than 25G NRZ, and has less impact on the 50G NRZ equalizer performance.

In general, it is beneficial to use 25G signals such as NRZ, Miller, or another run-length limited code (i.e. a code that encodes data in such a way as to avoid worst-case data patterns), as they reduce the impact of inter-symbol interference (ISI) by avoiding 010 and 101 patterns (in the 50G bit stream) which cause the worst-case inter-symbol interference impact for typical PON channels.

The conventional way to generate a 25G Miller signal, is to take a 25G signal and apply delay-encoding to it. This encoding however is non-systematic (i.e., the encoded input bits are not present in the output after applying the Miller encoding, thus also requiring a dedicated decoder at the receive side), and is not compatible with the interleaving and scrambling steps in the G.9804 standard. This would also require a modified downstream physical synchronization block (PSBd). As the Miller ONUs cannot receive the original PSBd header (which is transmitted without protection), a second PSBd header has to be introduced so that the Miller ONUs could synchronize. This is undesirable.

Similarly, 25G NRZ can be realized by repeating every bit in a 25G pattern twice. This has a similar issue as Miller (i.e., is incompatible with scrambling and requires a second PSBd).

SUMMARY OF THE INVENTION

Amongst others, it is an object of embodiments of the present disclosure to generate the low rate NRZ and Miller signals in a manner that is compliant to the G.9804 standard.

According to a first aspect of the invention, there is provided an apparatus for use by an OLT communicatively connected to optical network units, ONUs, comprising means for performing: obtaining a stream of codewords, comprising a first type codeword and a second type codeword, wherein, the first type codeword is an idle codeword, and the second type codeword comprises data intended for at least one of the ONUs; obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits; determining values for one or more redundant bits placed between two adjacent information bits in the interleaved bitstream based on the values of either or both of the two adjacent information bits, to reduce inter-symbol interference on either or both of the two adjacent information bits; transmitting the interleaved bitstream to one or more of the ONUs.

According to a second aspect of the invention, there is provided a method, for use by an OLT, communicatively connected to ONUs, comprising: obtaining a stream of codewords, comprising a first type codeword and a second type codeword, wherein, the first type codeword is an idle codeword, and the second type codeword comprises data intended for at least one of the ONUs; obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits; determining values for one or more redundant bits placed between two adjacent information bits in the interleaved bitstream based on the values of either or both of the two adjacent information bits, to reduce inter-symbol interference on either or both of the two adjacent information bits; transmitting the interleaved bitstream to one or more of the ONUs.

According to a third aspect of the invention, there is provided a computer program comprising instructions for causing an apparatus to perform at least the following: obtaining, at an OLT, communicatively connected to ONUs, a stream of codewords, comprising a first type codeword and a second type codeword, wherein, the first type codeword is an idle codeword, and the second type codeword comprises data intended for at least one of the ONUs; obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits; determining values for one or more redundant bits placed between two adjacent information bits in the interleaved bitstream based on the values of either or both of the two adjacent information bits, to reduce inter-symbol interference on either or both of the two adjacent information bits; transmitting the interleaved bitstream to one or more of the ONUs.

According to a fourth aspect of the invention, there is provided an apparatus comprising at least one processor and at least one memory including computer program code, the at least one memory and the computer program code configured to with the at least one processor, cause the apparatus at least to perform: obtaining a stream of codewords, comprising a first type codeword and a second type codeword, wherein, the first type codeword is an idle codeword, and the second type codeword comprises data intended for at least one of the ONUs; obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits; determining values for one or more redundant bits placed between two adjacent information bits in the interleaved bitstream based on the values of either or both of the two adjacent information bits, to reduce inter-symbol interference on either or both of the two adjacent information bits; transmitting the interleaved bitstream to one or more of the ONUs.

According to a fifth aspect of the invention, there is provided a non-transitory computer readable medium comprising program instructions for causing an apparatus to perform at least the following: obtaining a stream of codewords, comprising a first type codeword and a second type codeword, wherein, the first type codeword is an idle codeword, and the second type codeword comprises data intended for at least one of the ONUs; obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits; determining values for one or more redundant bits placed between two adjacent information bits in the interleaved bitstream based on the values of either or both of the two adjacent information bits, to reduce inter-symbol interference on either or both of the two adjacent information bits; transmitting the interleaved bitstream to one or more of the ONUs.

According to a sixth aspect of the invention, there is provided a computer readable medium comprising program instructions for causing an apparatus to perform at least the following: obtaining a stream of codewords, comprising a first type codeword and a second type codeword, wherein, the first type codeword is an idle codeword, and the second type codeword comprises data intended for at least one of the ONUs; obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits; determining values for one or more redundant bits placed between two adjacent information bits in the interleaved bitstream based on the values of either or both of the two adjacent information bits, to reduce inter-symbol interference on either or both of the two adjacent information bits; transmitting the interleaved bitstream to one or more of the ONUs.

According to the example embodiments, a DS signal with lower rate may be generated while being compliant to the high-rate standard. For example, a 25G DS signal could be generated while being compliant to the 50G standard. The signal experiences reduced impact of ISI, thus improving the sensitivity. It is expected that minimum amendments are required at the OLT, and that 50G-legacy ONUs would be able to receive and decode the 25G signals generated in this way.

BRIEF DESCRIPTION OF THE FIGURES

For a more complete understanding of example embodiments of the present invention, reference is now made to the following descriptions taken in connection with the accompanying drawings in which.

Same or similar reference numerals refer to same or similar parts or components.

DETAILED DESCRIPTION

Figure 1:
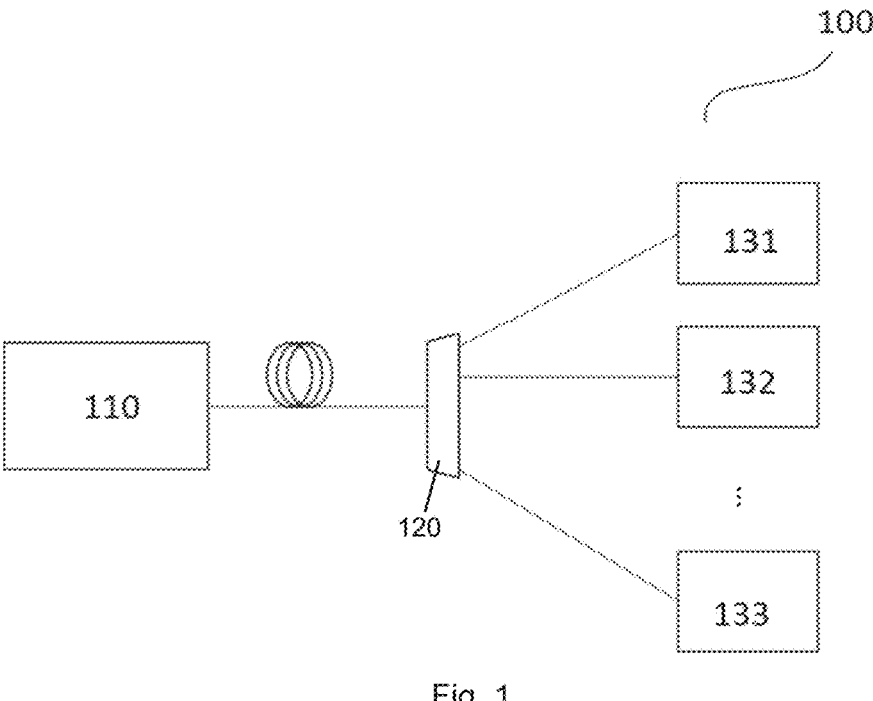
FIG. 1 shows a part of an exemplifying communication network in which examples of disclosed embodiments may be applied.

Example embodiments of the present application are described herein in detail and shown by way of example in the drawings. It should be understood that, although specific embodiments are discussed herein there is no intent to limit the scope of the invention to such embodiments. To the contrary, it should be understood that the embodiments discussed herein are for illustrative purposes, and that modified and alternative embodiments may be implemented without departing from the scope of the invention as defined in the claims. The sequence of method steps is not limited to the specific embodiments, the method steps may be performed in other possible sequence. Similarly, specific structural and functional details disclosed herein are merely representative for purposes of describing the embodiments. The invention described herein, however, may be embodied in many alternate forms and should not be construed as limited to only the embodiments set forth herein.

FIG. 1 shows a part of an exemplifying communication network in which examples of disclosed embodiments may be applied.

As shown in FIG. 1 in a passive optical network, PON, 100, an OLT 110 at the network side is used to connect to a plurality of ONUs 131, 132, . . . , 133 at the user side by means of an optical distribution network (ODN) or fiber plant 120 that contains optical fibers and splitters, but no active components. A skilled person shall understand the number of ONUs is not limited to the given example. The OLT 110 may be connected to for example up to 64 ONUs.

Most PON technologies such as G-PON, E-PON, and XG(S)-PON are time-division multiplexing (TDM) PON technologies, in which the fiber medium is shared in time between the different ONUs. In addition, time- and wavelength-division multiplexing (TWDM) PON technologies exist, such as next-generation NG-PON2, in which multiple TDM systems at different wavelength are stacked on the same PON system. Example embodiments apply to both TDM and TWDM PON systems.

In the following, various embodiments will be elaborated in the framework of 50G PON. A skilled person shall understand, as the technique advances, various embodiments may be implemented in the framework of other standards.

Figure 2:
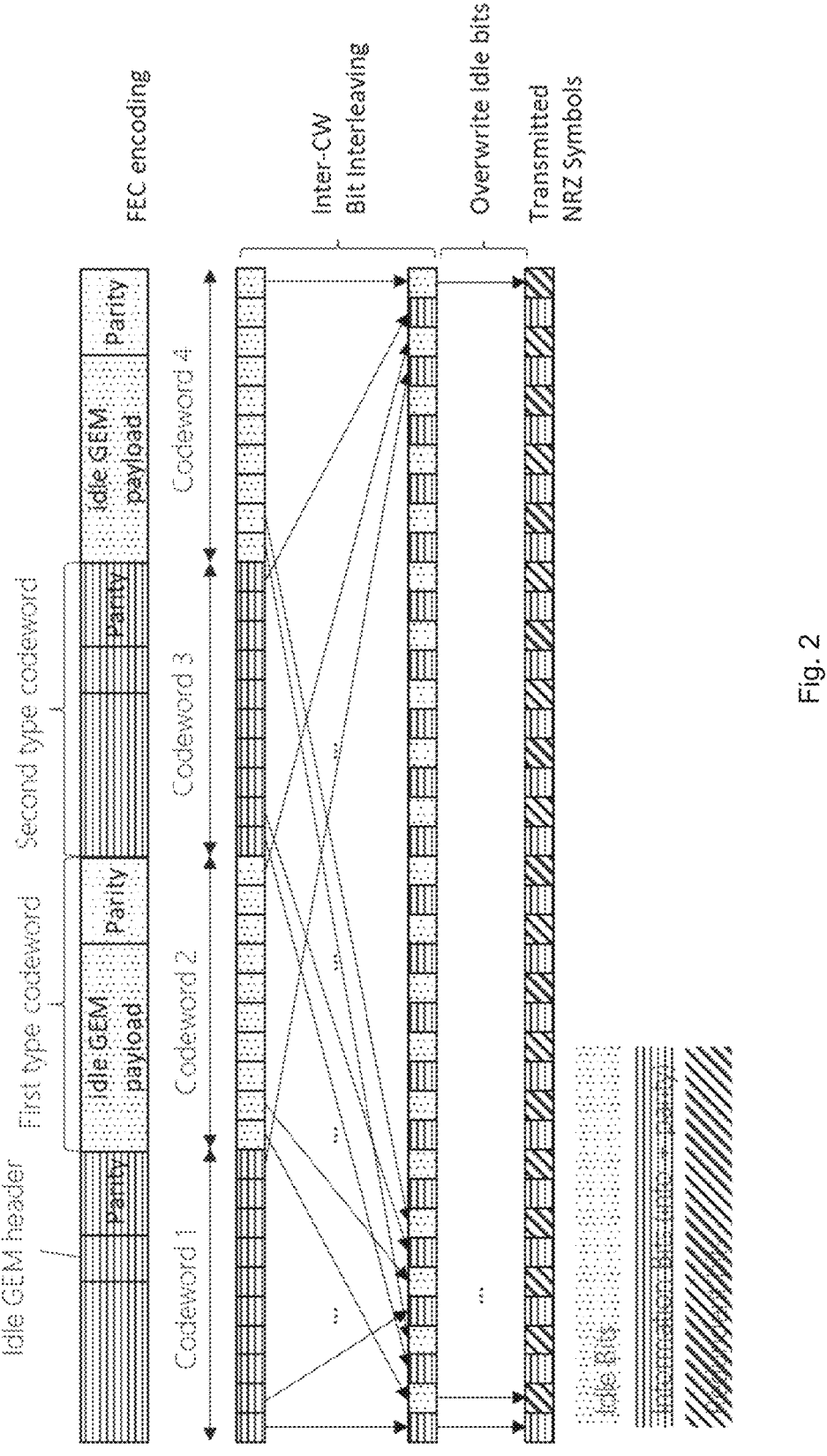
FIG. 2 shows an example illustration of an interleaved stream transmitted by the OLT in the downstream direction to the ONUs according to an example embodiment.

FIG. 2 shows an example illustration of an interleaved stream transmitted by the OLT in the downstream direction to the ONUs according to an example embodiment.

Various embodiments may be implemented at an OLT in a PON for example at the OLT 110 in FIG. 1. In the embodiment shown in FIG. 2, The OLT 110 obtains a stream of codewords, as shown in the first line of FIG. 2. The stream of codewords comprises a first type codeword and a second type codeword, wherein, the first type codeword is an idle codeword, and the second type codeword comprises data intended for at least one of the ONUs, for example, ONU 131, 132, . . . , 133. The codewords may correspond to codewords of a forward error correction (FEC) code, for example a low-density parity check (LDPC) or a Reed-Solomon (RS) code. The FEC codewords that are interleaved may have a fixed length, and may contain an information part and a parity part wherein the parity part may be obtained by encoding the information part based on the FEC code. The codewords may be scrambled based on a predetermined bit pattern after FEC encoding. As the technique advances, the codewords may be other possible codewords and may have different and/or variable length.

In FIG. 2, the stream of codewords comprises four codewords, the second and the fourth codewords are the first type codeword, drawn with dotted pattern, the first and third codewords are the second type codeword, drawn with horizontal lines. A skilled person shall understand, the stream of codewords may comprise more or less codewords. For example, the stream of codewords may comprise 360 codewords, for a downstream frame. In the example of FIG. 2, each codeword comprises 10 bits. A skilled person shall understand, the number of bits in a codeword is only given for illustrative purpose. In another example, a codeword may comprise 17280 bits. With the development, the size of a codeword may be different from the given examples.

Meanwhile, the codeword position arrangement of the first type codeword and the second type codeword may also be different from the given example. Generally, the codeword position arrangement comprises the amount of codewords in the stream of codewords, the amount of first type codewords, and the amount of second type codewords. More specifically, it defines which codewords in the stream of codewords are the first type codewords and which codewords are the second type codewords. In one embodiment, the codeword position arrangement may further comprise the location of the stream of codewords in a downstream frame.

In one example, there may be only one codeword being the first type codeword in the whole downstream frame. In another example, there may be half, a quarter, or 3 quarters of the codewords in the stream of codewords being the first type codewords, while the other codewords in the stream of codewords are the second type codewords. Accordingly, when half of the codewords in the stream of codewords are the first type codewords, the rate of the resulted signal is reduced to half of the normal rate. When 3 quarters of the codewords in the stream of codewords are the first type codewords, the rate of the resulted signal is reduced to one fourth of the normal rate. In the embodiment of FIG. 2, the second and fourth codewords are the first type codewords, and the first and third codewords are the second type codewords. In another embodiment, the first and third codewords may be the first type codewords, while the second and fourth codewords may be the second type codewords.

Generally, the idle codeword may be a codeword comprising idle bits. Specifically, the G.9804 PON standard has defined idle (X)GEM packets, which do not comprise any data intended for any ONU in the PON. In the embodiment shown in FIG. 2, an idle codeword may be a FEC codeword which has been subsequently scrambled. And the FEC codeword which in its information part fully comprises payload of an idle GEM packet together with the associated parity obtained by FEC encoding the information part. In one embodiment, the payload of the idle GEM packet codeword may comprise bits all with "0" value or bits all with "1" value. In other embodiments, the payload of idle GEM packets may comprise bits with predetermined patterns, with random values or bits with other values.

In one embodiment, the stream of codewords may comprise a predetermined number of codewords, and the interleaved bitstream comprises bitwise interleaved bits from the predetermined number of codewords.

A skilled person shall understand, the predetermined number is related to the interleaving scheme. For example, according to the G9804.2 standard, the codewords are bitwise interleaved in subgroups of four codewords. Accordingly, the predetermined number is four in the example shown in FIG. 2. With the development of the technique, other interleaving scheme may be developed. The predetermined number may also be any other possible number larger than or equal to 2.

Further referring to the last line shown in FIG. 2, the OLT 110 obtains an interleaved bitstream from the stream of codewords based on an interleaving scheme, wherein, in the interleaved bitstream, bits at positions corresponding to the first type codeword comprise redundant bits, drawn with diagonal stripes, and bits at positions corresponding to the second type codeword comprise information bits, drawn with horizontal lines. As indicated in the figure, these information bits cover both the information part and the parity part of the second type codeword.

Specifically, the interleaving scheme may define how the stream of codewords is interleaved. For example, it may define the number of codewords in a subgroup for the bitwise interleaving.

Values for one or more redundant bits placed between two adjacent information bits in the interleaved bitstream are determined based on the values of either or both of the two adjacent information bits, to reduce inter-symbol interference on either or both of the two adjacent information bits.

The values of the redundant bits may be determined to improve other aspects, e.g., to improve clock and data recovery, etc.

Specifically, the values for the one or more redundant bits may be determined to cause either or both of the two adjacent information bits respectively to be part of a respective sequence of consecutive identical bits in the interleaved bitstream.

More specifically, a minimal number of the consecutive identical bits may be predetermined. For example, the sequence of consecutive identical bits may comprise at least two identical bits. In the example of FIG. 2, in the stream of codewords shown in the first line, the first type codeword and the second type codeword appear alternatingly. In the interleaved bitstream shown in the last line, every two adjacent information bits has one redundant bit between each other. The value of the redundant bit may be determined for example by copying the value of the previous information bit or by copying the value of the subsequent information bit.

More specifically, the values for the one or more redundant bits may be determined further based on a coding scheme selected from a plurality of predetermined coding schemes.

In an example, the coding scheme may be implemented as a coding table which specifies the values for the one or more redundant bits for each possible set of values of the relevant information bits. The coding table may be predetermined for example based on the predetermined minimum number of identical bits. Alternatively, the coding table may be determined by the OLT at run-time, which will be elaborated further below. The coding table may also be optionally communicated by the OLT to the ONUs.

An OLT may determine the value for a redundant bit based on its nearest preceding information bit and the value of its nearest subsequent information bit by looking up a coding table. In an embodiment where there are more than one redundant bits between two adjacent information bits, the values of the sequence of redundant bits between two adjacent information bits may also be determined based on the value of either or both of the two adjacent information bits for example by looking up another coding table.

Figure 3A:
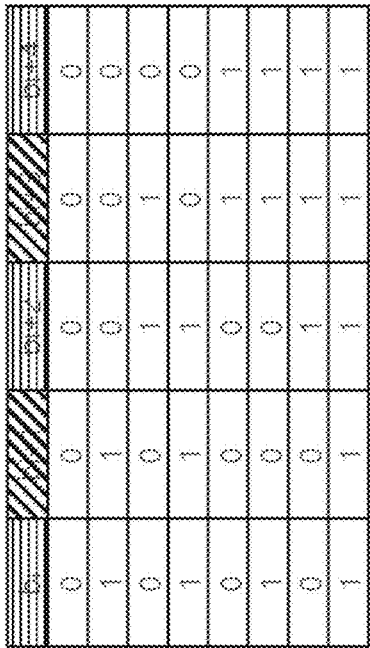
FIGS. 3a and 3b show two exemplary coding tables that may be applied to determine the values of the redundant bits.
Figure 3B:
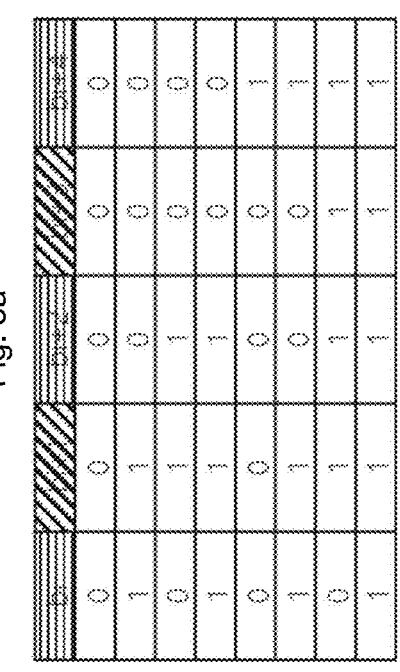

FIGS. 3a and 3b show two exemplary coding tables that may be applied to determine the values of the redundant bits.

In the examples given in FIGS. 3a and 3b, bits at positions bi, bi+2 and bi+4 are information bits, and bits at positions bi+1 and bi+3 are redundant bits, to be determined based on the values of the information bits. In this example, bits at positions bi+1, bi+2 . . . , bi+4 are respectively corresponding to codeword 1, 2, . . . 4.

The entries in the look-up table are chosen so that patterns of "010" and "101" never occurs around an information bit. In another example, where there are three or more redundant bits between two adjacent information bits, patterns of "010" and "101" may occur on the redundant bits. For typical PON channels, these transitions cause the worst-case detrimental ISI. By excluding these transitions, a signal comprising the redundant bits, the values of which are determined based on the values of either or both of the two adjacent information bits, may have similar properties as a Miller-encoded signal, in the sense that the signal experiences reduced impact of ISI.

Furthermore, in the example of FIGS. 3a and 3b, the values of a redundant bit may be determined based on one nearest preceding information bit and two nearest subsequent information bits. For example, in line 2 and line 6 of the coding table in FIG. 3a, for the redundant bit bi+1, its preceding information bit bi and its subsequent information bit bi+2 are respectively having the value of "1" and "0", but the value of the redundant bit bi+1 may be different based on the value of the second subsequent information bit bi+3. A skilled person should understand, in other coding tables, the value of a redundant bit may be determined on either or both of its nearest preceding information bit and its nearest subsequent information bit. For example, a 25G NRZ signal could be generated by setting bit bi+1 equal to bi and bi+3 to bi+2, which may be an alternative coding table. In yet other coding tables, the value of a redundant bit may be determined based on the values of one or more nearest preceding information bits and/or the values of one or more nearest subsequent information bits.

The coding table does not have to be implemented by an actual look-up table, but could be any type of encoder, for instance a convolution encoder. This way of coding may be used to yield a signal that has similar characteristics as a Miller encoded signal (delay encoded), in the sense that it is more resilient to ISI.

In an embodiment, the stream of codewords may be obtained further based on the codeword position arrangement of the first type codeword and the second type codeword as explained above. In that case, the coding scheme may be selected based on the codeword position arrangement and the interleaving scheme.

A skilled person should understand, the codeword position arrangement and the interleaving scheme may be used together to determine which bit positions in the interleaved bitstream comprise information bits. The values of either or both of two adjacent information bits may be used as reference when consulting a coding table, so as to determine the values of one or more redundant bits placed between the two adjacent information bits. If different codeword position arrangements are used for different streams of codewords, the coding table selected for these streams of codewords may also be different. In an example, the first and third codewords are the first type codewords, while the second and fourth codewords are the second type codewords. In such case, bits at positions bi+1 and bi+3 are information bits, while bits at positions bi and bi+2 are redundant bits to be determined, the coding tables shown in FIGS. 3a and 3b should not be applied. Similarly, if different interleaving schemes are used for different streams of codewords, the coding table selected for these streams of codewords may also be different.

In the following, the coding scheme, the codeword position arrangement and the interleaving scheme may be generally referred to as configuration parameters. At least one item from the configuration parameters may be determined based on at least one of channel quality, capability, and service requirement of one or more of the ONUs.

Specifically, the channel quality may be the bit rate error (BER) or other metric reflecting the channel quality of one or more of the ONUs. Capability of one or more of the ONUs may refer to the downstream rate or operation mode supported by the ONU. Service requirement of one or more of the ONUs may refer to the downstream rate or error tolerance required by the ONU.

While, as explained, the introduction of the redundant bits will improve the BER of the information bits in the 25G sections, it might also lead to a worse BER in the 50G sections. This is because the redundant bits will modify the signal characteristics which may affect the equalizer training in the ONU, leading to a worse equalizer for the 50G sections. Here the amount of impact on the 50G sections, depends both on the amount of 25G sections that are being mixed with the 50G sections, and the configuration parameters that are used for the 25G sections. Typically, there is a trade-off, in the sense that better 25G sensitivity leads to higher penalty on the 50G sections. To mitigate the impact on the 50G sections, in one example, the configuration parameters may be determined based on for example the amount of ONUs that need protection. Examples of use-cases are given below:

If few ONUs are in 25G protection mode, only few 25G sections have to be introduced. This will minimally impact the 50G equalizer, and thus the 50G sensitivity. In this case a configuration (coding scheme) can be used that gives maximal protection, without affecting the 50G equalizer/ sensitivity, as the 25G sections are not occurring often in the frame.

When many ONUs are in 25G protection mode, and there are many 25G sections in the frame, the configuration could be chosen to provide moderate protection, but with minimal impact on the 50G sensitivity.

In another example, the configuration settings can also be determined based on the channel quality of the ONUs. For instance, for ONUs with a channel quality slightly worse than 50G sensitivity, the data intended for such ONUs can be placed in sections with a configuration offering moderate protection and minimal impact on the 50G sensitivity. For ONUs with an even worse channel quality, the data intended for such ONUs can be placed in sections that offer a strong protection and a higher impact on the 50G sensitivity.

The configuration for a specific ONU may also be changed at runtime. This can be generally done with a granularity of the predetermined number of codewords, as explained above. For example, the predetermined number may be 4 in which case every 4 codewords are interleaved. In case CW 1 and 3 contain information, this could also be done in a granularity of 2 codewords. Such adaptation allows changing the amount of protection in case of dynamic channel conditions.

Specifically, obtaining an interleaved bitstream from the stream of codewords may be implemented in various ways. In the embodiment shown in FIG. 2, the stream of codewords is first interleaved into an intermediate bitstream based on the interleaving scheme, as shown in the second and third lines of FIG. 2. In this embodiment, the first type codeword may comprise idle bits, drawn with dotted pattern in the first three lines of FIG. 2.

Then, values for one or more idle bits in the intermediate bitstream is(are) overwritten with the determined values for the one or more redundant bits to obtain the interleaved bitstream.

Although in the embodiment shown in FIG. 2, all idle bits are replaced by redundant bits, a skilled person shall understand that it is not essential to have all the idle bits replaced by the redundant bits.

In the embodiment of FIG. 2, 25G signals may be generated in a way compatible with the 50G G.9804 standard. Such 25G signals may be mixed with 50G signals, or even with other modulation formats, such as 100G PAM4. For instance, the first N sections of the frame may contain the 25G signal as described above, while the rest of the frame may contain regular 50G signals. Alternatively, the 25G sections and 50G sections may be mixed alternatingly in a certain fraction, for part of the frame.

The advantage of various embodiments compared to for instance conventional 25G Miller encoding is that it is compatible with 50G G.9804 standard, in the sense that it can be implemented by generating a frame according to the G.9804 standard, and then applying an additional step of adding redundancy bits, by overwriting the idle bits). FEC encoding, scrambling and interleaving as defined in the G.9804 standard can still be applied, and then only the additional step of adding redundancy needs to be applied.

Various embodiments are compliant with the G.9804 standard also in the sense that certain implementations of G.9804-compliant 50G ONUs that are not aware of this coding technique (which we will call legacy ONUs from now on) will still be able to process and decode signals generated according to the invention. The legacy ONUs will first de-interleave the signal generated according to FIG. 2, then descramble and perform the FEC decoding. Since the codewords with information are valid 50G FEC codewords, the legacy ONUs will be able to decode these codewords. The codewords with redundant bits however will not be decodable as they contain redundant bits that do not satisfy the constraints of the LDPC code. Hence these codewords will be seen as uncorrectable codewords.

In the embodiment of FIG. 2, the second type codeword may comprise an idle GEM packet header, right at the end of the information part of the second type codeword, or earlier. The idle GEM packet header comprises an indication of the idle GEM payload size, which is selected so that the header of the subsequent GEM packet, which contains again data, starts in the next second type codeword. This subsequent GEM packet header can be at the beginning or somewhat later of the next second type codeword. Based on the ONU-ID in the idle GEM header, which is for instance selected to match none of the active ONUs, all the ONUs will be instructed to jump over the uncorrectable codewords, and there is no loss of data due to the uncorrectable codewords, provided that the ONUs do no lose synchronization due to too many uncorrectable codewords.

When the DS signal is transmitted according to various embodiments, legacy 50G ONUs will see an improved BER in the generated 25G sections due to reduced ISI, even when using the regular 50G equalizer. Hence by just applying the proposed invention, the sensitivity of legacy ONUs, that use 50G adaptive equalizers, can be improved by for instance 3 dB depending on the circumstances.

In the example of FIG. 2, the interleaving is performed before the idle bits are overwritten by the redundant bits, and the value of redundant bits may be determined after interleaving. In another embodiment, the interleaving may be performed after the values of the redundant bits are determined, which will be elaborated with the help of FIG. 4.

Figure 4:
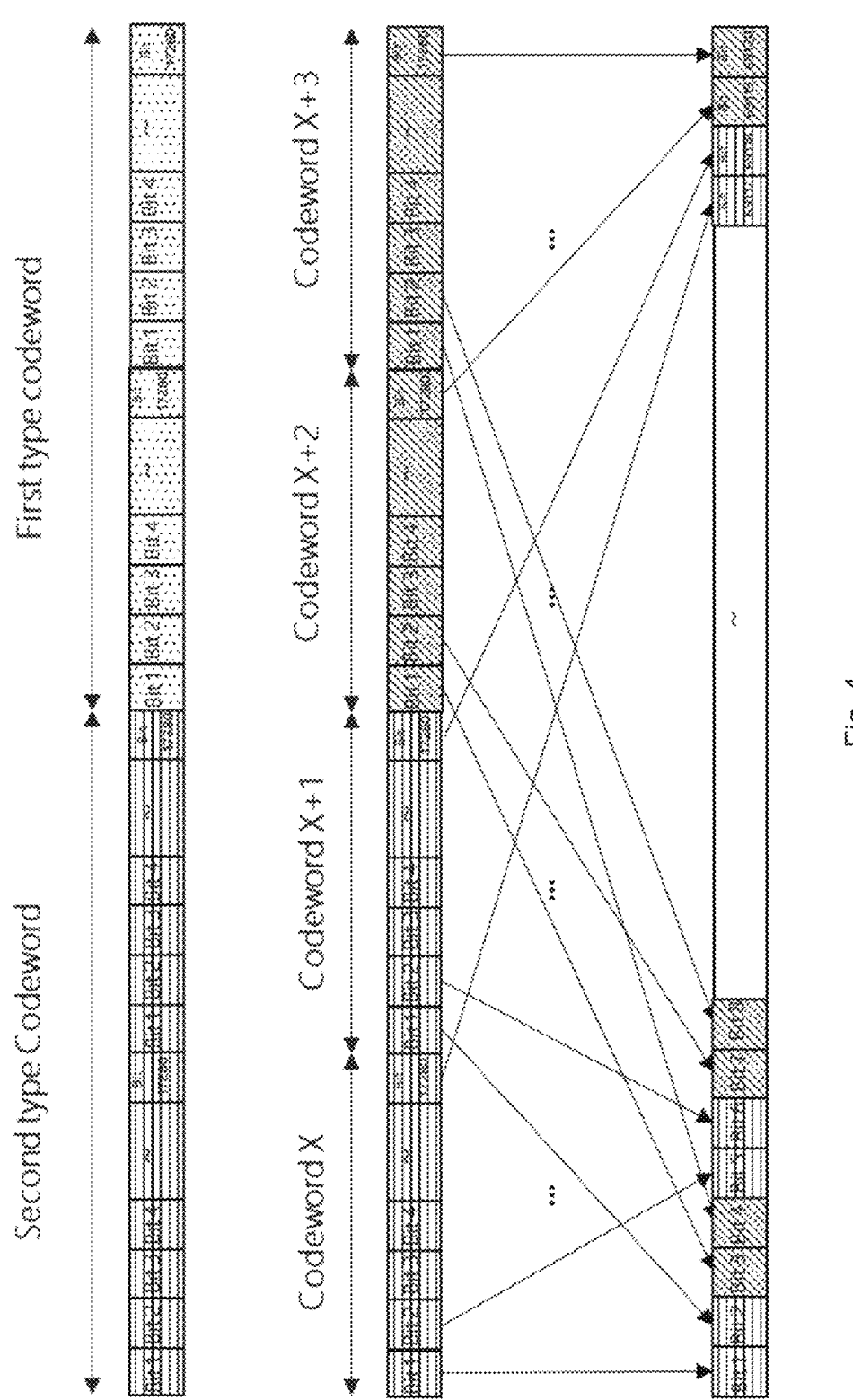
FIG. 4 shows an example illustration of an interleaved stream transmitted by the OLT in the downstream direction to the ONUs according to another example embodiment.

FIG. 4 shows an example illustration of an interleaved stream transmitted by the OLT in the downstream direction to the ONUs according to another example embodiment.

In the embodiment shown in FIG. 4, the stream of codewords comprises four codewords for simplicity. The first two codewords are the second type codewords, drawn with horizontal lines, the last two codewords are the first type codewords, drawn with dotted pattern.

Specifically, FIG. 4 shows another way of obtaining an interleaved bitstream from the stream of codewords. In the embodiment shown in FIG. 4, the values for the one or more redundant bits, drawn with diagonal stripes, may be determined further based on the interleaving scheme. For example, the interleaving scheme may be used to determine bit position of a redundant bit in the interleaved bitstream, and to determine which information bits are the nearest preceding information bit and the nearest subsequent information bit of the redundant bit in the interleaved bit stream.

A further stream of codewords, as shown in the second line of FIG. 4, may be determined based on the values for the one or more redundant bit and may also be determined taking into account the scrambling, if necessary. Although called as "a further stream of codewords", it should be understood that the codewords in the further stream refer to groups of bits with the same length as the FEC codewords they are interleaved with. The codewords comprising the one or more redundant bit will in general not satisfy the constraint of the FEC code. Then the further stream of codewords may be interleaved based on the interleaving scheme, to obtain the interleaved bitstream, as shown in the last line of FIG. 4.

In the embodiment shown in FIG. 4, all the bits of the first type codeword in the first line of FIG. 4 are replaced by redundant bits as shown in the second line of FIG. 4. A skilled person shall understand it not essential to have all the bits in the first type codewords replaced by redundant bits.

The interleaved bitstream, for example as shown in the last line of FIGS. 2 and 4 is transmitted to one or more of the ONUs communicatively connected to the OLT. In one example, the interleaved bitstream may be NRZ modulated before being transmitted.

Generally, it is advantageous to obtain a downstream frame starting with the interleaved bitstream, wherein the first N of the predetermined number of codewords associated with the interleaved bitstream are the second type codewords. A skilled person should understand, $1 \leq N <$ the predetermined number. Specifically, N may be 1 or 2.

In PON systems, the downstream frame typically starts with the PSBd, which includes a physical synchronization sequence (PSync) for ONUs to synchronize on, a superframe counter (SFC) structure, which is necessary to decode the downstream signals, and an operation control (OC) structure, which contains information on the PON system. After the PSBd, which is 192 bits long in the G.9804 standard, follows the framing sublayer (FS) header, which contains the bandwidth map (BWmap), i.e., the schedule for upstream bursts, and downstream physical layer operation and maintenance (PLOAMd) messages, which are control messages. The FS header can have a variable length, dependent on the number of allocations in the BWmap and the number of PLOAM messages. After the FS header follows the FS payload comprising GEM packets.

In the embodiment as shown in FIG. 2, N=1. In this example, the PSBd and FS header may be placed in the first codeword. Since the PSBd and FS header will be part of the generated 25G pattern, it will have an improved BER, and ONUs will be able synchronize more easily. Placing the PSBd and FS header in the first codewords does however introduce a limitation on the FS header length. This can be ensured by limiting the total length of the PSBd and FS header, by having a limited number of downstream PLOAM messages and bandwidth allocations in the FS header. In case the second codeword is the first type codeword as in the example above, the PSBd and FS header would have to be smaller than 1 codeword, while the standard allows a maximal PSBd and FS header length that is less than 4 codewords long. Alternatively, in another example, 12.5G DS rate may be generated by configuring the first codeword as the second type codeword, and the second to the fourth codewords as the first type codewords. This also allows using the invention at the beginning of the frame, in which case the PSBd and FS header will be placed in this first codeword.

In the embodiment of FIG. 4, N=2. The PSBd and FS header may be placed in the first two codewords. This allows the PSBd to be 2 codewords long, which is sufficient for typical use-cases. It also requires introducing only one idle GEM packet that jumps over 2 redundant FEC codewords, rather than 2 that each jump over 1 CW.

In the embodiment shown in FIG. 4, the redundancy bits at bit positions $bi+2$ and $bi+3$ may be calculated based on the values of information bits at bit positions $bi$, $bi+1$, $bi+4$, $bi+5$. Alternatively, the redundancy bit at bit position $bi+2$ may be set equal to $bi+1$ and the redundancy bit at bit position $bi+3$ to $bi+4$, to obtain 25G NRZ. In some embodiments, the values of the redundant bits may be determined based on information bits outside of the block of 4 interleaved codewords, for instance in the example of FIG. 4, the last two redundant bits in the interleaved codeword, may be based on the next 2 bits, i.e., the first 2 bits of the following section of 4 interleaved codewords.

Figure 5:
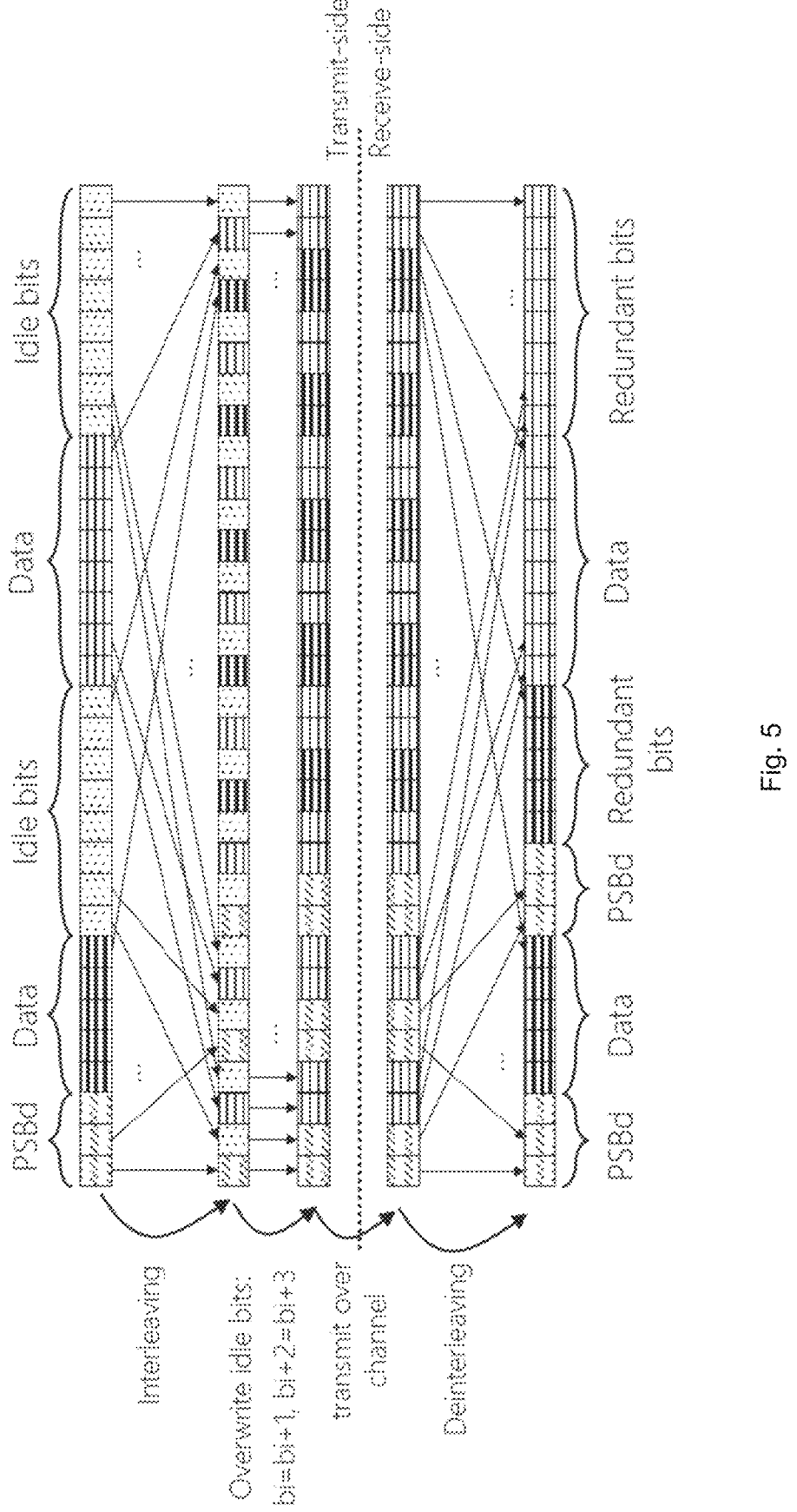
FIG. 5 shows an example illustration of an interleaved stream and a deinterleaved stream according to another example embodiment.

FIG. 5 shows an example illustration of an interleaved stream and a deinterleaved stream according to another example embodiment.

The embodiment shown in FIG. 5 is similar as the one shown in FIG. 2. The first and the third codewords are the second type codewords, drawn with horizontal lines, while the second and the fourth codewords are the first type codewords, comprising idle bits drawn with dotted pattern. The first codeword comprises the PSBd at the beginning, drawn with stripe slashes. Thick horizontal lines are used to indicate the information bits comprised in the first codeword, while thin horizontal lines are used to indicate the information bits comprised in the third codewords.

In the embodiment shown in FIG. 5, idle bits are all overwritten by redundant bits copying the value of its respective preceding information bit.

Depending on the employed coding table, synchronization issues can arise in the downstream. At startup, the ONU synchronizes to the downstream signal by searching for the PSync, which is mandatorily added by the OLT at the beginning of each frame (the continuous DS signal is subdivided in frames). Once the ONU located the PSync and PSBd header, it can derive the frame and codeword boundaries and extract the required data to decode the data. During nominal operation, the ONU may use the PSBd header to verify its synchronization.

In the embodiment shown in FIG. 5, after the interleaved bitstream is received at ONU side, two PSBds may be recovered, one original at the beginning of the first codeword and one duplicated at the beginning of the second codeword. In this case, when a new ONU intends to join, it can join at any moment in time and thus synchronize on any of the two PSync patterns. Synchronization using the original PSBd will not lead to any issues. In contrast, synchronizing on the copied PSBd will result in an alignment offset leading to faulty decoding of the data. Depending on the implementation of a particular ONU, it may have no possibility to detect this faulty synchronization or it may require a long time to do so. This results in a malfunctioning ONU or a prohibitively long synchronization time. Since both the default 50G ONUs as well as the ONUs making use of the reduced-rate mode need to perform this synchronization step when joining, all ONUs may be affected by this issue.

To solve this problem, in one example, one or more items of the coding scheme, the codeword position arrangement, and the interleaving scheme may be switched for example on a frame-to-frame basis, at least for the PSBd part of the frame, so that the duplicated PSBd may appear at different positions in the deinterleaved bitstream between consecutive frames, with reference to the last line of FIG. 5.

In one embodiment, the OLT obtains a plurality of downstream frames respectively starting with their respective interleaved bitstreams.

At least one item from the configuration parameters may be switched according to a predetermined pattern for the plurality of downstream frames.

Specifically, the predetermined pattern defines a sequence of configuration parameters that are applied, and a number of consecutive frames or location and length of subframes to which the respective configuration parameter is applied.

For example, the switching may be carried out based on a frame to frame basis, or a subframe basis.

Specifically, in one embodiment, a first configuration parameter may comprise indicating the first and third codewords in the stream of codewords as the second type codewords and the second and fourth codewords as the first type codewords, with each redundant bit repeating the previous bit. A second configuration parameter may comprise indicating the first and second codewords as the second type codewords, the third and fourth codewords as the first type codewords, with redundant bits corresponding to the third codeword repeating the previous bit, and redundant bits corresponding to the fourth codeword repeating the next bit. A skilled person should understand the first configuration parameter and the second configuration parameter are given only for illustrative purpose. Other configuration parameters may be applied in other examples.

In one example, the first configuration parameter may be applied for a first downstream frame, and the second configuration parameter may be applied for a subsequent downstream frame. In another example, the first configuration parameter may be applied for a first part of a second downstream frame, and the second configuration parameter may be applied for a second part of the second downstream frame. In yet another example, the first configuration parameter may be applied for a first number of consecutive downstream frames, and the second configuration parameter may be applied for a second number of subsequent downstream frames.

Specifically, the first codeword associated with respective one of the plurality of downstream frames is the second type codeword. In this case, the PSBd may be comprised in the second type codeword.

For example, the coding scheme may be switched between two well-chosen coding tables on a frame-by-frame basis, or every X frames, with X for instance being 2. These coding tables are chosen such that the original PSBd header remains at its original location and the duplicated PSBd header is present at different positions from frame to frame. Both tables provide the same or approximately the same protection. A practical example of such a set of coding tables are the 2 coding tables for 25G NRZ, i.e. copying the preceding information bit or copying the subsequent information bit.

Figure 6:
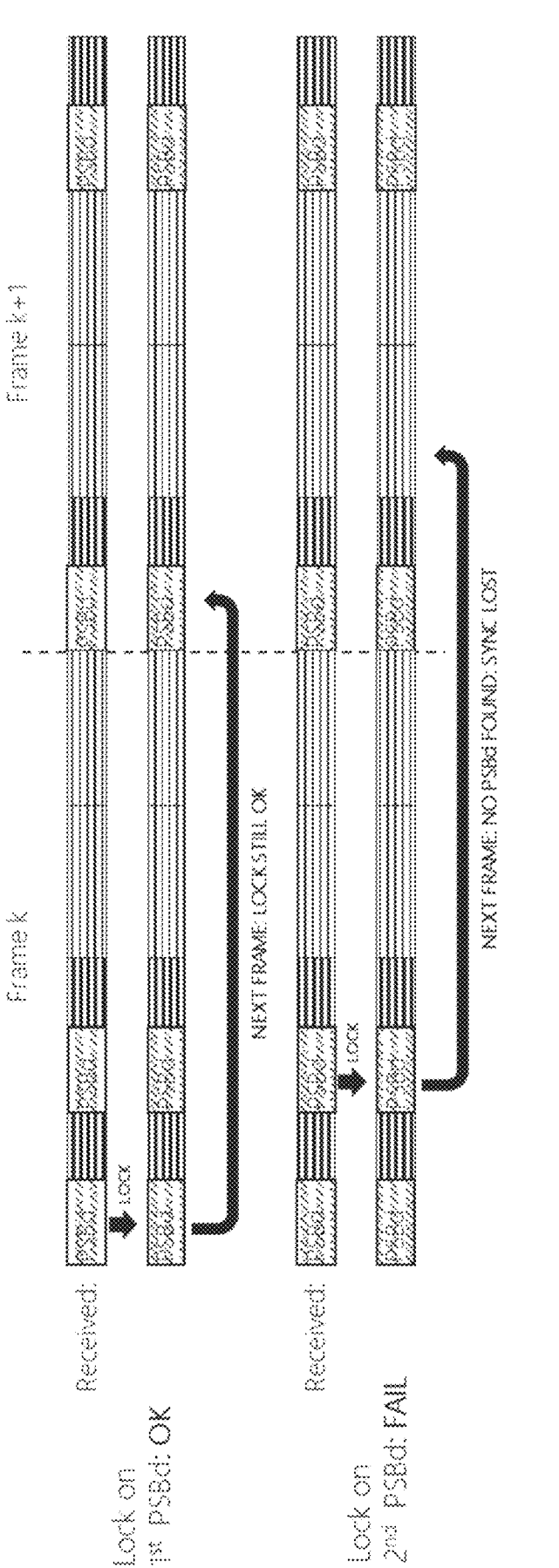
FIG. 6 shows an example illustration of deinterleaved downstream frames at ONU side.

FIG. 6 shows an example illustration of deinterleaved downstream frames at ONU side.

Specifically, in the embodiment shown in FIG. 6, different coding tables may be applied for frame k and frame k+1. Additionally, or alternatively, in other examples, the codeword position arrangement and/or the interleaving scheme may be switched based on a frame to frame basis.

As can be seen from FIG. 6, the location of the duplicated PSBd in Frame k is at the beginning of the second codeword, while the location of the duplicated PSBd in Frame k+1 is at the beginning of the fourth codeword. The location of the duplicated PSBd is different from frame to frame in the deinterleaved frame.

Changing the location of the duplicated PSBd header from frame to frame will ensure fast and correct synchronization of the ONU. Although the details of the synchronization mechanisms are internal to the ONU and are not subject to standardization, synchronization state machines are proposed in the appropriate ITU standard to realise systems which are reasonably immune to both false lock and false loss of synchronization. Common to all proposed systems is that after an initial search for the PSYNC pattern (Hunt state), the ONU transition into a Pre-Sync state, where it has to verify its timing on subsequent frames, so at least 1 extra frame.

As can be seen from the first two lines in FIG. 6, if an ONU locks on the original PSBd header in the first frame k, it may lock on the next PSBd header in the second frame at the correct location. However, if an ONU locks on the duplicated PSBd header in the first frame, then it will not be able to lock on the duplicated PSBd header in the second frame as the position of this duplicated PSBd header has changed. This forces ONUs to return to the hunt state and retry locking, until it eventually locks on the correct PSBd.

This provides a possibility to any ONU, independent of its implementation, to quickly recognize a faulty lock and obtain robust synchronization, much faster compared to a system not employing this coding table switching.

Although the issue of duplicated PSBd headers is natural using the mentioned coding tables for 25G NRZ, other coding tables can also be affected. As few errors are allowed in the PSBd, a coding table that results in a duplicated PSBd with only a few errors may still lead a faulty synchronization in the ONU. For example, in a coding table, a redundant bit $b_{i+1}$ may almost but not always the same as data bit $b_i$.

In other examples, switching between more than two coding tables and/or on a sub-frame basis is also possible. For example, a first part of the PSBd header may use a first coding table while a second part of the PSBd header may use a second coding table. Alternatively, a third coding table can be used for the remainder of the frame.

The proposed technique is still compliant with the ITU standard and can be fully orchestrated from the OLT side without any ONU adaptations. ONUs that want to make use of the redundant bits to further improve their sensitivities need be aware of this switching and may take into account the changing for example of the coding tables accordingly, synchronized with the OLT.

Figures 7, 8:
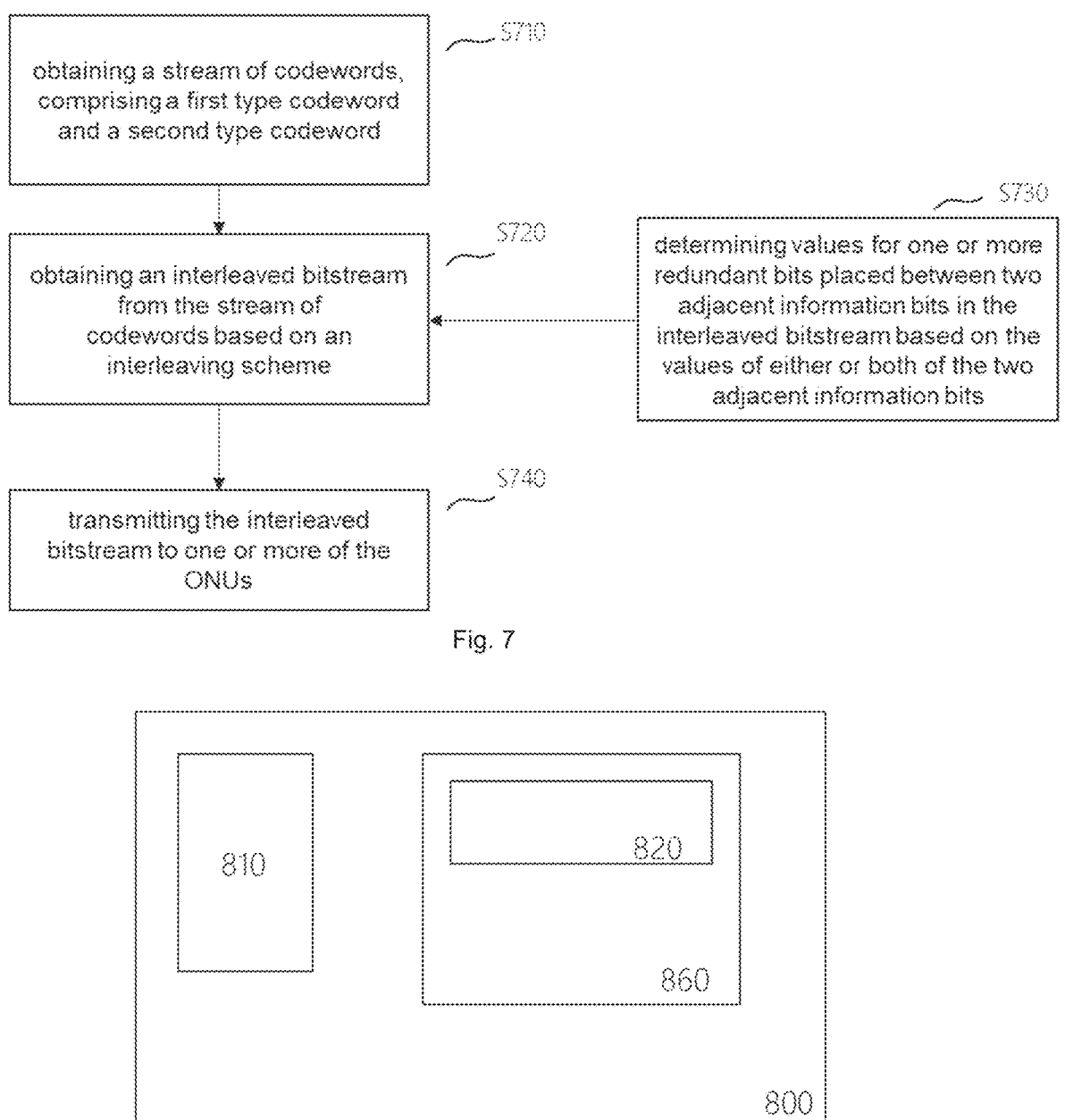
FIG. 7 shows a block diagram of a method according to various embodiments.
FIG. 8 shows a block diagram of an apparatus according to various embodiments.

FIG. 7 shows a block diagram of a method according to various embodiments.

The method may be implemented at an OLT, for example the OLT 110 in FIG. 1, communicatively connected to ONUs 131, 132, 133.

The method starts at step S710 with obtaining a stream of codewords, comprising a first type codeword and a second type codeword, wherein, the first type codeword is an idle codeword, and the second type codeword comprises data intended for at least one of the ONUs.

At step S720, the method continues with obtaining an interleaved bitstream from the stream of codewords based on an interleaving scheme, wherein, in the interleaved bitstream, bits at positions corresponding the first type codeword comprise redundant bits, and bits at positions corresponding to the second type codeword comprise information bits.

At step S730, values for one or more redundant bits placed between two adjacent information bits in the interleaved bitstream are determined based on the values of either or both of the two adjacent information bits, to reduce inter-symbol interference on either or both of the two adjacent information bits.

Specifically, the values for one or more redundant bits may be determined prior to or after interleaving to obtain the interleaved bitstream. Detailed description has been given above and will not be repeated here for simplicity.

At step S740, the method continues with transmitting the interleaved bitstream to one or more of the ONUs.

FIG. 8 shows a block diagram of an apparatus according to various embodiments.

The apparatus 800 operating in accordance with an example embodiment may be implemented at an OLT, for example, the OLT 110 in FIG. 1. The apparatus 800 may be implemented as an electronic device such as a chip, chip-set, an electronic device or an access network controller. The apparatus 800 includes a processor 810 and a memory 860. In other examples, the apparatus 800 may comprise multiple processors.

In the example of FIG. 8, the processor 810 is a control unit operatively connected to read from and write to the memory 860. The processor 810 may also be configured to receive control signals received via an input interface and/or the processor 810 may be configured to output control signals via an output interface. In an example embodiment the processor 810 may be configured to convert the received control signals into appropriate commands for controlling functionalities of the apparatus 800.

The memory 860 stores computer program instructions 820 which when loaded into the processor 810 control the operation of the apparatus 800 as explained above. In other examples, the apparatus 800 may comprise more than one memory 860 or different kinds of storage devices.

Computer program instructions 820 for enabling implementations of example embodiments of the invention or a part of such computer program instructions may be loaded onto the apparatus 800 by the manufacturer of the apparatus 800, by a user of the apparatus 800, or by the apparatus 800 itself based on a download program, or the instructions can be pushed to the apparatus 200 by an external device. The computer program instructions may arrive at the apparatus 200 via an electromagnetic carrier signal or be copied from a physical entity such as a computer program product, a memory device or a record medium such as a Compact Disc (CD), a Compact Disc Read—Only Memory (CD-ROM), a Digital Versatile Disk (DVD) or a Blu-ray disk.

According to an example embodiment, the apparatus 800 comprises means, wherein the means comprises at least one processor 810, at least one memory 860 including computer program code 820, the at least one memory 860 and the computer program code 820 configured to, with the at least one processor 810, cause the performance of the apparatus 800.

Embodiments of the present invention may be implemented in software, hardware, application logic or a combination of software, hardware and application logic. The software, application logic and/or hardware may reside on the apparatus, a separate device or a plurality of devices. If desired, part of the software, application logic and/or hardware may reside on the apparatus, part of the software, application logic and/or hardware may reside on a separate device, and part of the software, application logic and/or hardware may reside on a plurality of devices. In an example embodiment, the application logic, software or an instruction set is maintained on any one of various conventional computer-readable media. In the context of this document, a 'computer-readable medium' may be any media or means that can contain, store, communicate, propagate or transport the instructions for use by or in connection with an instruction execution system, apparatus, or device, such as a computer, with one example of a computer described and depicted in FIG. 7. A computer-readable medium may comprise a computer-readable storage medium that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus for use by an Optical Line Terminal, (OLT) communicatively connected to optical network units (ONUs) comprising:

at least one memory configured to store computer program code; and at least one processor configured to execute the computer program code and cause the apparatus to perform, obtaining a stream of codewords, comprising a first type codeword and a second type codeword, wherein, the first type codeword is an idle codeword, and the second type codeword comprises data intended for at least one of the ONUs;

obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits;

determining values for one or more redundant bits placed between two adjacent information bits in the interleaved bitstream based on the values of either or both of the two adjacent information bits, to reduce inter-symbol interference on either or both of the two adjacent information bits;

transmitting the interleaved bitstream to one or more of the ONUs.

2. The apparatus according to claim 1, wherein the apparatus is further caused to perform determining the values for the one or more redundant bits to cause either or both of the two adjacent information bits respectively to be part of a respective sequence of consecutive identical bits in the interleaved bitstream.

3. The apparatus according to claim 1, wherein a minimal number of the consecutive identical bits is predetermined.

4. The apparatus according to claim 1, wherein the apparatus is further caused to perform:

interleaving the stream of codewords into an intermediate bitstream based on the interleaving scheme, wherein the first type codeword comprises idle bits;

overwriting values for one or more idle bits in the intermediate bitstream with the determined values for the one or more redundant bits to obtain the interleaved bitstream.

5. The apparatus according to claim 1, wherein, the values for the one or more redundant bits are determined further based on the interleaving scheme, and wherein the apparatus is further caused to perform determining a further stream of codewords based on the values for the one or more redundant bit;

interleaving the further stream of codewords based on the interleaving scheme, to obtain the interleaved bitstream.

6. The apparatus according to claim 1, wherein the stream of codewords comprises a number of codewords, and the interleaved bitstream comprises bitwise interleaved bits from the number of codewords.

7. The apparatus according to claim 1, wherein the apparatus is further caused to perform obtaining a downstream frame starting with the interleaved bitstream, wherein the first N of the number of codewords associated with the interleaved bitstream are the second type codewords.

8. The apparatus according to claim 7, wherein N is 1 or 2.

9. The apparatus according to claim 1, wherein the values for the one or more redundant bits are determined further based on a coding scheme selected from a plurality of coding schemes.

10. The apparatus according to claim 9, wherein the apparatus is further caused to perform determining at least one of the coding scheme, the codeword position arrangement and the interleaving scheme based on at least one of channel quality, capability, and service requirement of one or more of the ONUs.

11. The apparatus according to claim 9, wherein the apparatus is further caused to perform obtaining a plurality of downstream frames respectively starting with their respective interleaved bitstreams;

switching at least one of the coding scheme, the codeword position arrangement, and the interleaving scheme according to a pattern for the plurality of downstream frames.

12. The apparatus according to claim 1, wherein the apparatus is further caused to perform obtaining the stream of codewords based on a codeword position arrangement of the first type codeword and the second type codeword; and selecting the coding scheme based on the codeword position arrangement and the interleaving scheme.

13. The apparatus according to claim 1, wherein the first codeword associated with respective one of the plurality of downstream frames is the second type codeword.

14. A method for use by an Optical Line Terminal (OLT), communicatively connected to optical network units (ONUs), comprising:

obtaining a stream of codewords, comprising a first type codeword and a second type codeword, wherein, the first type codeword is an idle codeword, and the second type codeword comprises data intended for at least one of the ONUs;

obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits;

determining values for one or more redundant bits placed between two adjacent information bits in the interleaved bitstream based on the values of either or both of the two adjacent information bits, to reduce inter-symbol interference on either or both of the two adjacent information bits;

transmitting the interleaved bitstream to one or more of the ONUs.

15. A non-transitory computer-readable medium storing computer program code, which when executed by a processor, cause an apparatus including the processor to perform obtaining, at an Optical Line Terminal (OLT) communicatively connected to optical network units (ONUs) a stream of codewords, comprising a first type codeword and a second type codeword, wherein, the first type codeword is an idle codeword, and the second type codeword comprises data intended for at least one of the ONUs;

obtaining, an interleaved bitstream from the stream of codewords based on an interleaving scheme, wherein, in the interleaved bitstream, bits at positions corresponding to the first type codeword comprise redundant bits, and bits at positions corresponding to the second type codeword comprise information bits;

determining values for one or more redundant bits placed between two adjacent information bits in the interleaved bitstream based on the values of either or both of the two adjacent information bits, to reduce inter-symbol interference on either or both of the two adjacent information bits;

transmitting the interleaved bitstream to one or more of the ONUs.

* * * * *